United States Patent [19]

Yakushiji

[11] Patent Number: 4,992,844
[45] Date of Patent: Feb. 12, 1991

[54] SEMICONDUCTOR DEVICE

[75] Inventor: Shigenori Yakushiji, Yokohama, Japan

[73] Assignee: Kabushiki Kaisha Toshiba, Kawasaki, Japan

[21] Appl. No.: 147,273

[22] Filed: Jan. 22, 1988

[30] Foreign Application Priority Data

Jan. 23, 1987 [JP] Japan ................................. 62-12253

[51] Int. Cl.⁵ ........................ H01L 29/74; H01L 29/78
[52] U.S. Cl. .................................... 357/38; 307/570; 357/23.13; 357/43
[58] Field of Search ............... 357/38, 41, 43, 23.13; 307/570, 318, 246, 631, 634, 637

[56] References Cited

U.S. PATENT DOCUMENTS

| | | | |
|---|---|---|---|
| 3,999,212 | 12/1976 | Usuda | 357/23.13 |
| 4,041,332 | 8/1977 | Otthinata et al. | 307/634 |
| 4,063,115 | 12/1977 | Okuhara et al. | 307/637 |
| 4,224,634 | 9/1980 | Suedberg | 357/43 |
| 4,295,058 | 10/1981 | Lade et al. | 307/631 |
| 4,471,245 | 9/1984 | Janutka | 307/246 |
| 4,500,801 | 2/1985 | Janutka | 307/246 |
| 4,509,068 | 4/1985 | Stoisiek | 357/38 |
| 4,529,998 | 7/1985 | Lade et al. | 307/637 |

FOREIGN PATENT DOCUMENTS 60-74678 4/1985 Japan .

OTHER PUBLICATIONS

Yakushiji, "Patent Abstracts of Japan", Aug. 29, 1985, vol. 9, No. 212 (E-339) [1935].

Primary Examiner—Rolf Hille
Assistant Examiner—Peter T. Brown
Attorney, Agent, or Firm—Finnegan, Henderson, Farabow, Garrett, and Dunner

[57] ABSTRACT

A first short-circuiting MOS FET with a break-through preventing function is connected between the gate and the cathode of a high sensitivity thyristor. A second MOS FET is connected between the gate and the source of the first MOS FET. A gate signal turns on the second MOS FET to reduce the gate voltage of the first MOS FET below threshold voltage. In turn, the short-circuit of the gate to the cathode of the thyristor is removed. Specifically, the gate signal is applied to the gate of the thyristor to trigger it. When forward voltage VAK applied between the anode terminal and the cathode terminal of the thyristor element is larger than the threshold voltage of the first MOS FET, the gate of the first MOS FET is biased to a voltage above the threshold voltage so that the first MOS FET is turned on. Therefore, the gate and the cathode of the thyristor element are short-circuited to prevent the break-through of the thyristor due to the an external transient surge voltage. When gate voltage VGK is input between the gate terminal and the cathode terminal of the thyristor element, the second MOS FET is turned on, so that the gate voltage of the first MOS FET is below the threshold voltage. In turn, the first MOS FET is turned off to remove the short-circuit of the gate and the cathode of the thyristor element, so that the thyristor element is turned on. The gate current is supplied to the gate of the thyristor element to turn on the thyristor element.

18 Claims, 3 Drawing Sheets

SEMICONDUCTOR DEVICE

BACKGROUND OF THE INVENTION

This invention relates to a semiconductor device with a semiconductor substrate in which two insulated-gate field effect transistors and a thyristor element are formed. More particularly, this invention relates to a semiconductor device whose thyristor is capable of preventing the break-through, i.e., the error-trigger due to a transient surge voltage, and can be triggered at any time point in the voltage cycle appearing between the anode (A) and the cathode (K) of the thyristor.

Two prior art devices will be described by referring to the accompanying drawings. A first prior art device is a thyristor of the planar type, which is turned on by a small gate current. This thyristor will be referred to as a high by sensitive thyristor. A second prior art device is a high by sensitive semiconductor device of the planar type, which is free from break-through or spurious triggering caused by the transient voltage.

FIG. 1A shows, in cross sectional form, a prior art highly sensitive thyristor device, and FIG. 1B shows an equivalent circuit of the thyristor device. An example of the method of manufacturing the thyristor device will be described in brief. Separation region 1 for element separation is formed in $N^-$ semiconductor substrate 50 with resistivity of 40 to 50 $\Omega$cm. Region 1 separates the thyristor under discussion from other elements (not shown). Base layer 2 of the P conductivity type is formed in a first major surface layer (the upper surface region as viewed in the drawing) of substrate 50. At the same time, emitter layer 3 of the P conductivity type is formed in a second major surface layer (the lower surface region in the drawing) of substrate 50. P emitter region 3 also serves as an anode region of the thyristor element. Emitter layer 4 of the N conductivity type, which also serves as a cathode region of the thyristor element, is formed in the surface region of P base layer 2. Reference characters A, K and G, respectively, designate an anode terminal, a cathode terminal and a gate terminal, which are connected, via electrode wiring, to the P emitter layer (anode region), the N emitter layer (cathode region), and the base layer, respectively.

This thyristor device is used as a thyristor handling a relatively small current, e.g., 3A, and has the characteristic that the gate trigger current is very small, approximately several tens $\mu$A. When this thyristor is soley used, it is readily triggered by the leakage current due to high temperature and transient current induced by external surge voltages. In practical use, a resistor is externally connected between the gate (G) and the cathode (K), to reduce the gate trigger current to about 1 mA.

Turning now to FIGS. 2A and 2B, there are shown a cross sectional view of a high sensitivity thyristor device which is capable of preventing spurious triggering due to transient voltages. FIG. 2B is an equivalent circuit of that thyristor. Throughout the drawings, like symbols are used to designate like or equivalent elements. As seen from the drawing, this thyristor device is additionally provided with P well region 5 and P layer 34. Formed in P well region 5 are N drain layer 7, N source layer 8, gate oxide film 9 and gate electrode 10, which form a MOS FET functioning to prevent break-through. N layer 11 is also provided in P well region 5, in order to protect the gate oxide film of the FET. This N layer cooperates with P well region 5 to form a Zener diode.

The thyristor device thus structured is capable of turning on the thyristor by a minute gate trigger current, e.g., about 30 $\mu$A to 5 $\mu$A, and further is free from break-through due to transient and leakage currents. The electrodes (G and K) are almost short-circuited by the MOS FET element at all times, which is formed between these electrodes. Therefore, leakage transient currents are by-passed through the MOS FET. The voltage across electrodes G and K is kept below the forward voltage (0.5 to 0.6 V) at the PN junction between the cathode region 4 (N emitter layer 4) and the P base layer 2. The prior thyristor device has the advantages as mentioned above; however, it is disadvantageous in that it cannot be triggered at any phase of the A-K voltage ($V_{AK}$). Since the MOS FET is driven through P layer 34 by voltage $V_{AK}$, the voltage able to trigger the thyristor is below the gate threshold voltage of the MOS FET, and ranges approximately from 0 to 5 V. For this reason, when voltage $V_{AK}$ is above 5 V, even if the gate input signal is applied to the thyristor, the thyristor element is not triggered until the next cycle of voltage $V_{AK}$. In other words, under this condition, the trigger of the thyristor is delayed a maximum of about 20 msec (when the frequency of the power source is 50 Hz).

Incidentally, resistor $R_{GK}$ inserted between electrodes G and K is provided for limiting the trigger current to a desired value, e.g., 5 $\mu$A.

To reduce the size of the gate power source for the thyristor device, there is a strong demand to develop thyristor devices with a high gate sensitivity or triggerable by a small gate trigger current. The prior thyristor devices with high sensitivity shown in FIGS. 1A and 1B can be triggered by very small trigger current, 10 $\mu$A. This fact, however, implies that it is very sensitive to external transient voltages or it is readily broken through by transient voltages. To avoid this, the by-pass resistor is externally connected between electrodes G and K. However, use of the by-pass resistor results in an increase of the gate trigger current to about 1 mA.

The thyristor device of FIGS. 2A and 2B has been developed as the thyristor element which is free from break-through due to transient surge voltages, however, it is triqgerable by a small gate trigger current, e.g., 5 to 30 $\mu$A. Indeed, this thyristor device succeeded in solving sensitivity and breakthrough problems, but it suffers from another problem that the period allowing the thyristor to be triggered is very short. This new problem arises from the fact that the voltage between electrodes A and K is below the threshold voltage of the MOS FET.

SUMMARY OF THE INVENTION

Accordingly, an object of this invention is to provide a thyristor device which has a highly sensitive gate trigger characteristic and is free from breakthrough, i.e., the spurious triggering due to the leakage and transient currents, and can be triggered at any phase of the A-K voltage.

In the description to follow, including the specification and the appended claims, two conductivity types of semiconductor will be used; the first is the N conductivity type and the second is the P conductivity type. It is noted, however, that even if the conductivity types are interchanged with each other, almost the same descriptions hold.

A semiconductor device according to this invention is arranged such that a first short-circuiting MOS FET with the break-through preventive function is connected between the gate and the cathode of the high sensitivity thyristor, and a second MOS FET is connected between the gate and the source of the first MOS FET. A gate signal turns on the second MOS FET to reduce the gate voltage of the first MOS FET below the threshold voltage. In turn, the short-circuit between the gate and the cathode of the thyristor is removed. The gate signal is applied to the gate of the thyristor to trigger it.

A semiconductor device according to this invention comprises an $N^-$ semiconductor substrate, a PNPN layered thyristor element with the P base layer as a gate layer, a first MOS FET of the N channel type provided in a first P well region, which is formed in the semiconductor substrate apart from the P base layer, a second MOS FET of the N channel type provided in a second P well region, which is formed in the semiconductor substrate apart from the P base layer, said first and second P well regions being allowed to be separate from or interconnected with each other, and a separation P layer, which is formed in the substrate separating from the P base layer and first and second P well regions. The semiconductor device further comprises a first electrode interconnection for a gate signal circuit, which is formed on the major surface of the substrate and interconnects the separating P layer of the thyristor element, the first gate electrode of the first MOS FET, and the second drain layer of the second MOS FET: the gate terminal of the thyristor element, through a first resistor layer: a third electrode interconnection formed on the major surface of the substrate and interconnecting the cathode N emitter layer of the thyristor element, the first P well region and the first source layer of the first MOS FET, the second P well region and the second source layer of the second MOS FET, and the cathode terminal of the thyristor element: and a fourth electrode interconnection formed on the major surface of the thyristor element and for interconnecting the anode P emitter layer and the anode terminal of the thyristor element.

The operation of the semiconductor device will be described. It is assumed that forward voltage $V_{AK}$ is applied between the anode terminal (A) and the cathode terminal (K) of the thyristor element. When voltage $V_{AK}$ is larger than the threshold voltage of the first MOS FET, the gate of the first MOS FET is biased at a voltage above the threshold voltage, through the separation P layer. Under this condition, the FET is in an ON state. In other words, the gate P base layer and the cathode N layer of the thyristor element are short-circuited, to prevent the break-through, i.e., the spurious triggering of the thyristor due to an external transient surge voltage. When gate signal voltage $V_{GK}$ is input between the gate terminal and the cathode terminal of the thyristor element (between the electrodes G and K), the second MOS FET is turned on, so that the gate voltage of the first MOS FET is below the threshold voltage. In turn, the first MOS FET is turned off, to remove the short-circuit between the gate P base layer and the cathode N emitter layer of the thyristor element. As a result, the thyristor element is turned on. At the same time, the gate current caused by gate signal voltage $V_{GK}$ is fed through the first resistor layer to the gate P base layer to turn on the thyristor element. The first resistive layer decreases the gate signal voltage to the gate trigger voltage of the thyristor element. The gate oxide films of the first and second MOS transistors are limited in thickness because the characteristics such as the threshold voltage must be kept good. Therefore, the thickness of these films is frequently insufficient. To cope with this, it is necessary to use some means to prevent the dielectric breakdown of the gate oxide film. To this end, an N diffusion layer is formed in the surface layers of the first and second P well regions, while apart from the region for FET formation. The P well regions and the N type diffusion layer form Zener diodes. The Zener voltage is below the dielectric breakdown voltage of each gate insulating film. If any other means for preventing the dielectric breakdown is used, the Zener diodes may be omitted.

It is preferable that a second resistive layer for gate sensitivity adjustment is provided between the P base layer and the cathode N emitter layer. If so, the gate sensitivity of the thyristor element may be set to an estimated value.

According to the present invention, there is provided a semiconductor device comprising an anode terminal, a cathode terminal, a gate terminal, a thyristor having a gate, an anode, and a cathode, the anode being connected to said anode terminal, and the cathode being connected to said cathode terminal, a first switch element having a control terminal and a current path, the current path being connected between said cathode terminal and said gate of said thyristor, a second switch element having a control terminal and a current path, the current path being connected between said cathode terminal and said control terminal of said first switch element, and the control terminal being connected to said gate terminal.

According to the invention, there is further provided a semiconductor device comprising a semiconductor substrate of a first conductivity type, thyristor formed in said substrate, said thyristor including a base layer of a second conductivity type formed in a first major surface layer of said substrate, an emitter layer of the first conductivity type formed in the surface layer of said base layer, an emitter layer of the second conductivity type formed in a second major surface layer of said substrate, and a base region of the first conductivity type sandwiched by the base layer of the second conductivity type and the emitter layer of the second conductivity type, a first insulated gate field effect transistor formed in the semiconductor substrate, said transistor including a first well region of the second conductivity type, which is formed in said first major surface of said substrate while being apart from said base layer of the second conductivity type, a first drain and a first source both being of the first conductivity type and formed in the surface layer of said first well region, a gate oxide film formed in the substrate and between said first drain and said first source, and a first gate electrode formed on said gate oxide electrode, a second insulated gate field effect transistor formed in said substrate, said transistor including a second well region of the second conductivity type, which is formed in said first major surface of said substrate while being apart from said base layer of the second conductivity type, a second drain and a second source both being of the first conductivity type and formed in the surface layer of said second well region, a gate oxide film formed on the substrate and between said second drain and said second source, and a second gate electrode formed on said gate oxide electrode, a separation layer of said second conductivity type formed in said first major surface of said substrate and apart from said base layer of the second conductivity type, and said first and second well regions, a first electrode interconnection formed on the major surface of said substrate and for interconnecting said separation layer, said first gate electrode and said second drain layer, a second electrode interconnection for electrically interconnecting said base layer of the second conductivity type and said first drain layer with said second gate electrode and a gate terminal through a first resistive layer, a third electrode for electrically interconnecting said emitter layer of the first conductivity type, said first well region, said first source layer, said second well region, said second source layer and said cathode terminal, and a fourth electrode interconnection for electrically connecting said emitter layer of the second conductivity type and the anode terminal.

DETAILED DESCRIPTION OF THE PREFERRED EMBODIMENT

Figures 3, 4:
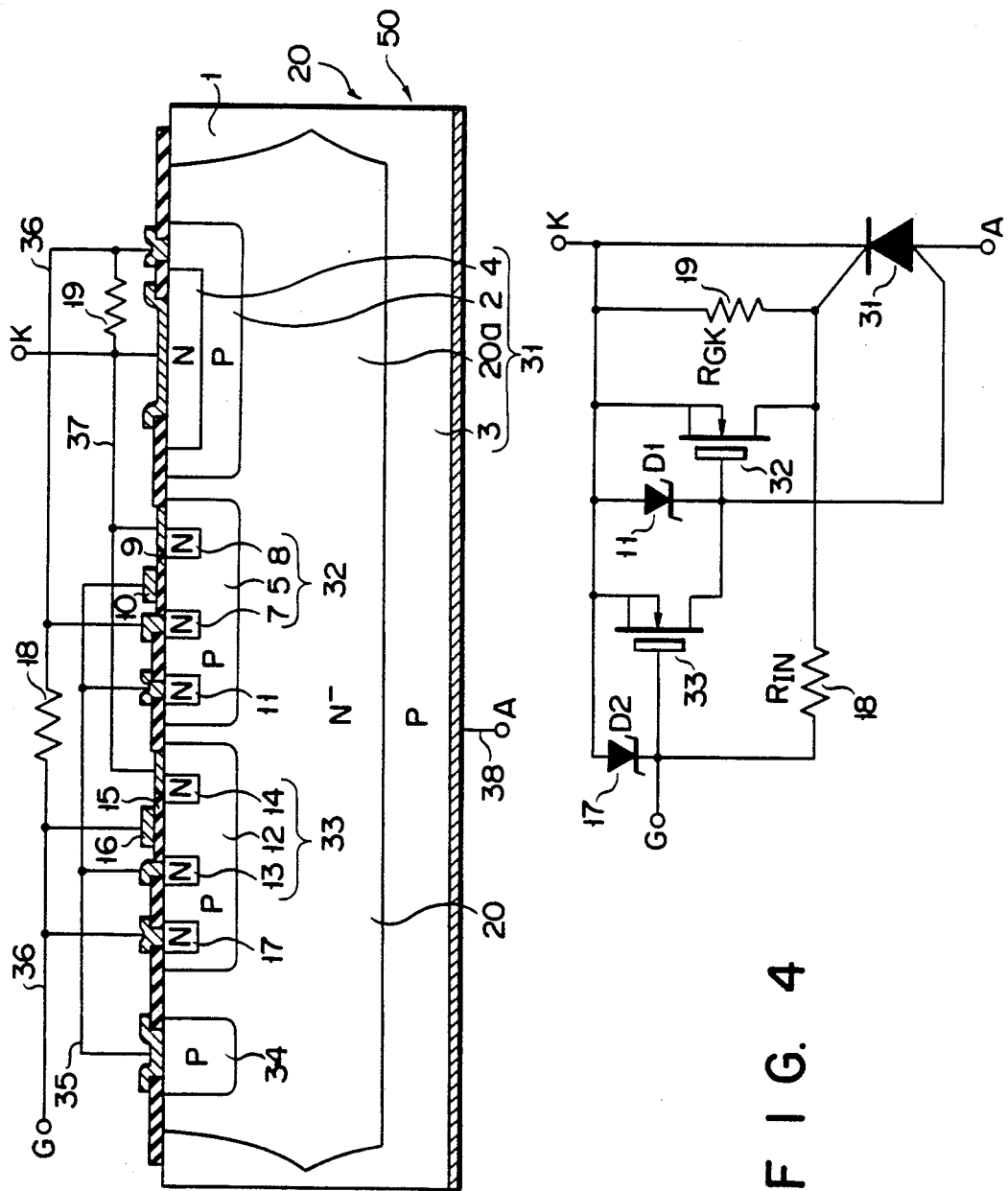
FIG. 3 shows a cross sectional view of a semiconductor device according to an embodiment of this invention.
FIG. 4 is an equivalent circuit of the semiconductor device of FIG. 3.

A planar type thyristor device as a semiconductor device according to embodiment of this invention will be described. FIGS. 3 and 4 show a cross sectional view of the thyristor device and its equivalent circuit, respectively.

Thyristor element 31 is formed in N⁻ region 20 of silicon substrate 50 of the N⁻ conductivity type. Thyristor element 31 includes P base layer 2, cathode N emitter layer (cathode layer of the thyristor element) 4, anode P emitter layer (anode layer of the thyristor element) 3, and $N^{31}$ base region 20a sandwiched by the P base layer and the anode P emitter layer. P base layer 2 is formed in the major surface layer (the upper surface region as viewed in the drawing) of the substrate. Cathode N emitter layer 4 is formed in the surface layer of the P base layer. Anode P emitter layer 3 is formed in the second major surface layer (the lower surface region as viewed in the drawing) of substrate 50.

Further formed in N⁻ region 20 is first MOS FET 32. This MOS FET includes first P well region 5, first N drain layer 7 and first N source layer 8, first gate oxide film 9, and first gate electrode 10. First P well region 5 is formed in the first major surface of the substrate, apart from the P base layer 2 of thyristor element 31. Drain layer 7 and source layer 8 are formed in the surface region of first P well region 5. First gate oxide film 9 is formed on the substrate surface and between the drain and source layers. N layer 11 is formed in the surface layer of the first P well region, apart from the region where the first MOS FET is formed. N layer 11 and the first P well region form a first Zener diode.

Second MOS FET 33 is also formed in N⁻ region 20. MOS FET 33 includes second P well region 12, second N drain layer 13 and second N source layer 14, second gate oxide film 15, and second gate electrode 16. Second P well region 12 is formed in the first major surface layer of N⁻ region 20, separate from P base layer 2 and first P well region 5. In the drawing, the first and second P well regions are separated from each other, however, these may be interconnected, if necessary. Second N drain layer 13 and second N source layer 14 are formed in the surface layer of second P well region 12. Second gate oxide film 15 is formed on the substrate surface and between the drain and source layers. Second gate electrode 15 is formed on second gate oxide film 15. N layer 17 is formed in the surface layer of the second P well region, apart from the region where the second MOS FET is formed. N layer 17 and the second P well region form a second Zener diode.

P layer 34 is also formed in the first major surface of N⁻ (region 20, separate from P base layer 2, first P well region 5 and section P well region 12. First electrode interconnection 35 is formed on the major surface of substate 50).

The interconnection 35 interconnects P layer 34, first gate electrode 10, second N drain layer 13, and the N layer 11 of first Zener diode. Second electrode interconnection 36 is formed on the major surface of substrate 50. This interconnection interconnects P base layer 2 and first N drain layer 7 to each other, and also interconnects second gate electrode 16, the N layer 17 of the second Zener diode and gate terminal G to one another. The interconnection electrically connects the former and the latter, through first resistive layer 18. Third electrode interconnection 37 is formed on the major surface of substrate 50. The interconnection 37 interconnects cathode N emitter layer 4, first P well region 5, first N source layer 8, second P well region 12, second N source layer 14 and cathode terminal K. Further formed on the major surface of substrate 50 is fourth electrode interconnection 38 electrically interconnecting anode P emitter layer 3 and anode terminal A. Second resistive layer 19 is provided between third electrode interconnection 37 and the portion of second electrode interconnection 36 interconnecting P base layer 2 and first N layer 7.

Figure 5A:
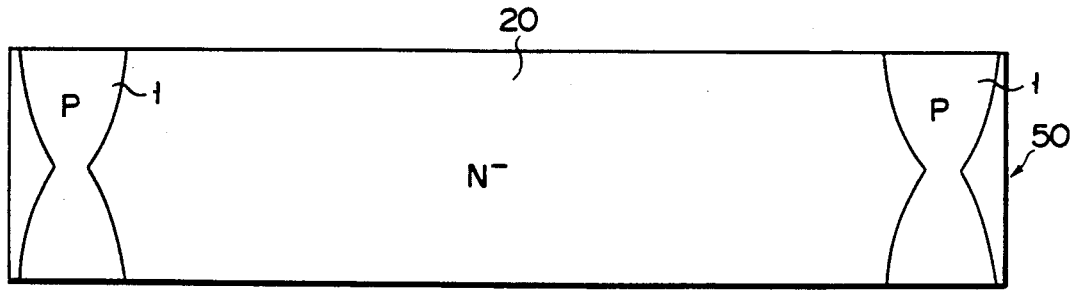
FIGS. 5A to 5D show cross sectional views for explaining a sequence of steps to manufacture the semiconductor device shown in FIG. 3.
Figure 5B:
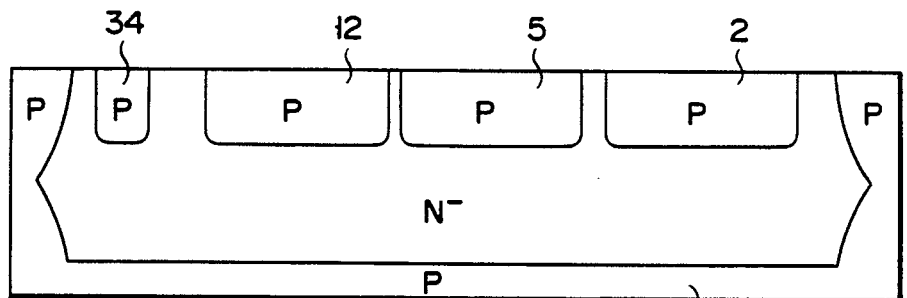
Figure 5C:
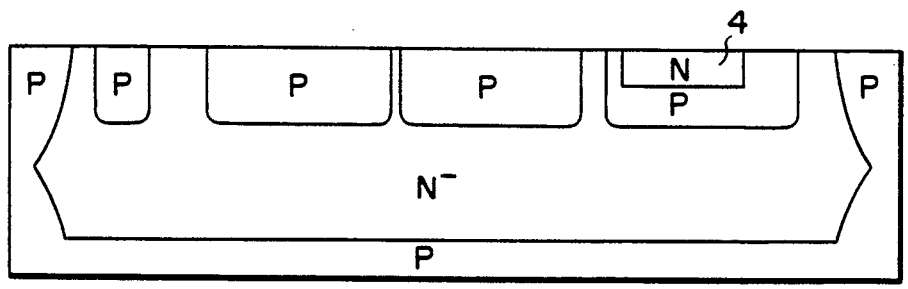
Figure 5D:
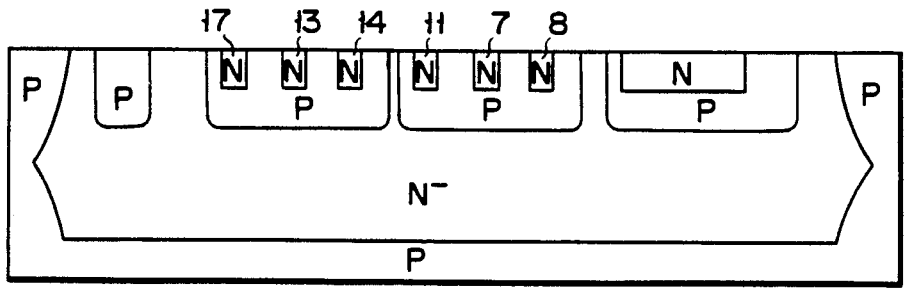

A sequence of process steps to manufacture the thyristor device shown in FIG. 3 will be described by referring to FIGS. 5A to 5D. Separation region 1 for separating individual element regions is formed in N⁻ type silicon substrate 50 whose resistivity is 40 to 50 Ωcm. Then, anode P emitter layer 3, P base layer 2, first P well region 5, second P well region 12 and P layer 34 are formed. In this case, the first and second P well regions and other layers may be formed simultaneously or individually. Selection of the simultaneous or individual formation of these elements depends on the design values such as the threshold voltage of the MOS FET (FIG. 5B). Cathode N emitter layer 4 is next formed (FIG. 5C). The drain and source layers 7 and 8 of the first MOS FET and those 13 and 14 of the second MOS FET, and the N layers 11 and 17 of first and second Zener diodes D1 and D2 of those FETs are further formed (FIG. 5D). Finally, the electrode interconnection material such as aluminum is vapor deposited and patterned to interconnect the elements as shown in the equivalent circuit of FIG. 4.

In FIGS. 5B to 5D, a side portion of separation region 1 is omitted for simplicity of illustration.

The operation of the thyristor device thus arranged will be described by referring to FIG. 4. It is now assumed that AC voltage $V_{AK}$ of 100 V is applied between electrodes A and K, and that voltage $V_{AK}$ causing the first MOS FET to short-circuit the gate and cathode of the thyristor element is 5 V or more. When voltage $V_{AK}$ exceeds 5 V in each voltage cycle, the first MOS FET is turned on, to short-circuit the gate and the cathode of first MOS FET 32. Under this condition, the thyristor element is protected from its break-through, i.e., the spurious triggering due to leakage or transient currents. Leakage current when the voltage is below 5 V, is very small, and cannot turn on the thyristor element. Provision of second resistive layer $R_{GK}$ for gate current restriction between the gate and the cathode enhances the break-through preventing function. P layer 34 is connected to anode P layer 1 through the $PN^{31}$ junction capacitor which is formed between the P layer and the $N^-$ region 20. When $V_{AK}>0$, the capacitance of that capacitor is very large, and the potential at the P layer 34 is substantially equal to the anode potential. When it is connected to other layers such as the P well regions by a depletion layer, the potential at the P layer 34 is 5 V or more, exhibiting a saturation tendency, if the voltage $V_{AK}$ is 5 V or more.

When the gate signal is input to the gate terminal G, second MOS FET 33 is turned on, so that the gate-source voltage of first MOS FET 32 drops below the threshold voltage, and first MOS FET 32 is turned off. As a result, the short-circuit state between the gate and the cathode is removed. Then, the gate trigger current of thyristor element 31 is equal to the value limited by the resistor $R_{GK}$, e.g., 5 to 30 µA. Since the gate signal is applied to the gate of the thyristor element through input resistor $R_{IN}$ (first resistive layer) 18, not the current path including the resistor $R_{GK}$, the thyristor element is immediately turned on. The Zener voltage of each of Zener diodes D1 and D2 is much smaller than the dielectric breakdown voltage of the gate oxide film, for the purpose of protecting the gate oxide film. Input resistor IN decreases the gate signal voltage above the threshold voltage of the second MOS FET to the gate trigger voltage of thyristor element 31.

Figure 1A:
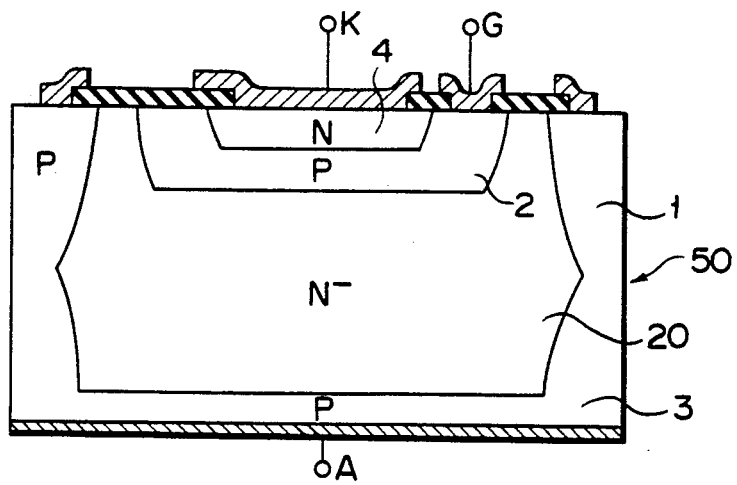
FIG. 1A shows a cross sectional view of a prior art high sensitive thyristor device.
Figure 1B:
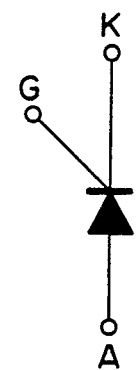
FIG. 1B is an equivalent circuit of the thyristor device of FIG. 1A.
Figure 2A:
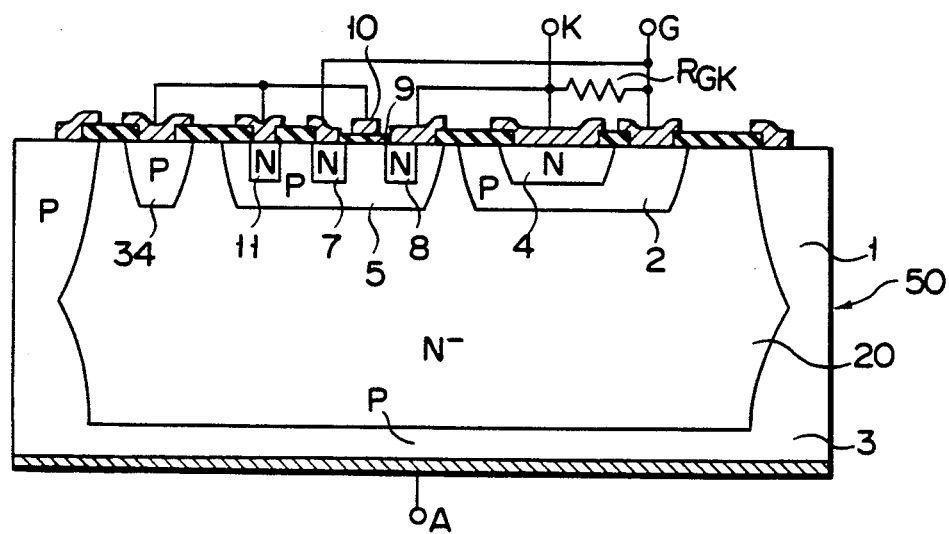
FIG. 2A shows a cross sectional view of another prior art high sensitive thyristor device.
Figure 2B:
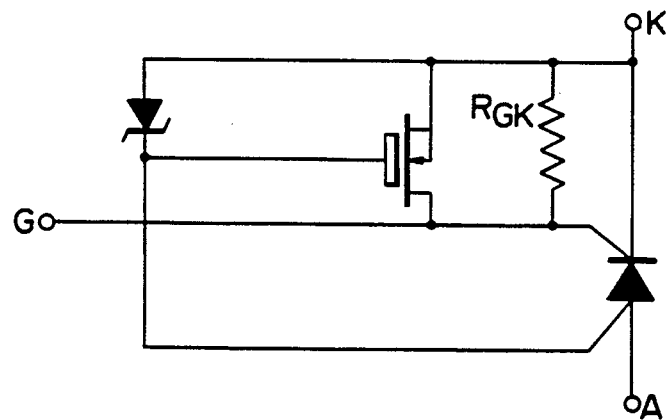
FIG. 2B is a equivalent circuit of the thyristor device of FIG. 2A.

The prior art thyristor device with the breakthrough preventive function as shown in FIGS. 2A and 2B cannot turn on the thyristor element when the A-K voltage is 5 V or more, as described earlier. The reason for this is that when the A-K voltage exceeds 5 V, the MOS FET for break-through prevention is turned on, and the gate and the cathode of the thyristor element is short-circuited, loosing its trigger function. This short-circuiting arises from the internal structure of the element, and therefore it is impossible to remove the short-circuiting by any external means.

On the other hand, the semiconductor device according to this invention, like the prior art semiconductor device, has the function to prevent the break-through due to the leak current or the transient current, while keeping the good gate trigger characteristic. The second MOS FET is used and is controlled by the external input gate signal so that the thyristor element is triggered at any time in the A-K voltage cycle.

In more particular, it is assumed that the thyristor device shown in FIG. 3 is designed to be of the type operable with minute current such that $I_{GT}$ representing the gate characteristic of thyristor element 31 (the gate current necessary to switch the thyristor element from the OFF state to the ON state) is 5 µA, and $V_{GT}$ (the gate voltage necessary to cause the gate current $I_{GT}$) is 0.5 V. In this thyristor device, the first MOS FET is active for the transient surge voltage, and hence $dv/dt=300$ V/µs. The thyristor device can be triggered at any time in the A-K voltage cycle. When $R_{IN}=250$ kΩ, the trigger current fed from the gate terminal is very small, 10 µA (for about 3 V $V_{GK}$).

What is claimed is:

1. A semiconductor device comprising:
   an anode terminal;
   a cathode terminal;
   a gate terminal for receiving a gate signal;
   a thyristor that can be turned on at any phase of a voltage applied across the anode and cathode terminals, comprising an anode, a cathode, a cathode base, and an anode base, said anode being connected to said anode terminal, said cathode being connected to said cathode terminal, and said cathode base being connected to said gate terminal, wherein the thyristor is turned on in response to the applying of the gate signal to the gate terminal;
   a first resistor connected between said gate terminal and said cathode base of said thyristor;
   a first switch element of a normally conductive type having a control terminal and a current path, said current path being connected between said cathode terminal and said cathode base of said thyristor, wherein the thyristor cannot be turned on at times when the first switch element is conductive; and
   a second switch element of a normally nonconductive type for controlling said first switch element, having a control terminal and a current path, said current path of said second switch element being connected between said cathode terminal and said control terminal of said first switch element, and said control terminal of said second switch element being connected to said gate terminal, wherein the second switch element is conductive at times when the gate signal is applied to the gate terminal to render the first switch element nonconductive.

2. A semiconductor device according to claim 1, further comprising a second resistor connected between said cathode terminal and said cathode base of said thyristor.

3. A semiconductor device comprising:
   an anode terminal;
   a cathode terminal;
   a gate terminal for receiving a gate signal;
   a thyristor that can be turned on at any phase of a voltage applied across the anode and cathode terminals, comprising an anode, a cathode, a cathode base, and an anode base, said anode being connected to said anode terminal, said cathode being connected to said cathode terminal, and said cathode base being connected to said gate terminal, wherein the thyristor is turned on in response to the applying of the gate signal to the gate terminal;
   a first switch element of a normally conductive type having a control terminal and a current path, said current path being connected between said cathode terminal and said cathode base of said thyristor, wherein the thyristor cannot be turned on at times when the first switch element is conductive;
   a second switch element of a normally nonconductive type for controlling said first switch element, having a control terminal and a current path, said current path of said second switch element being connected between said cathode terminal and said control terminal of said first switch element, and said control terminal of said second switch element being connected to said gate terminal, wherein the second switch element is conductive at times when the gate signal is applied to the gate terminal to render the first switch element nonconductive;
a first diode connected between said cathode terminal and said control terminal of said first switch element; and
a second diode connected between said cathode terminal and said control terminal of said second switch element.

4. A semiconductor device according to claim 2, further comprising a first resistor connected between said gate terminal and said cathode base of said thyristor.

5. A semiconductor device according to claim 2, further comprising a resistor connected between said cathode terminal and said cathode base of said thyristor.

6. A semiconductor device according to claim 4, further comprising a second resistor connected between said cathode terminal and said cathode base of said thyristor.

7. A semiconductor device comprising:
an anode terminal;
a cathode terminal;
a gate terminal for receiving a gate signal;
a thyristor comprising an anode, a cathode, a cathode base, and an anode base, said anode being connected to said anode terminal, said cathode being connected to said cathode terminal, and said cathode base being connected to said gate terminal;
a first switch element having a control terminal and a current path, said current path being connected between said cathode terminal and said cathode base of said thyristor; and
a second switch element for controlling said first switch element, having a control terminal and a current path, said current path of said second switch element being connected between said cathode terminal and said control terminal of said first switch element, and said control terminal of said second switch element being connected to said gate terminal;
in which said first switch element is a first insulated-gate field effect transistor, and said second switch element is a second insulated-gate field effect transistor, said control terminal and said current path of said first switch element are a gate and a drain-source path of said first insulated-gate field effect transistor, respectively and said control terminal and said current path of said second switch element are a gate and a drain-source path of said second insulated-gate field effect transistor, respectively.

8. A semiconductor device comprising:
an anode terminal;
a cathode terminal;
a gate terminal;
a thyristor comprising an anode, a cathode, a cathode base, and an anode base, said anode being connected to said anode terminal, said cathode being connected to said cathode terminal, and said cathode base being connected to said gate terminal;
a first switch element having a control terminal and a current path, said current path being connected between said cathode terminal and said cathode base of said thyristor;
a second switch element for controlling said first switch element, having a control terminal and a current path, said current path of said second switch element being connected between said cathode terminal and said control terminal of said first switch element, and said control terminal of said second switch element being connected to said gate terminal;
a first diode connected between said cathode terminal and said control terminal of said first switch element, in which said first diode is a Zener diode; and
a second diode connected between said cathode terminal and said control terminal of said second switch element, in which said second diode is a Zener diode.

9. A semiconductor device comprising:
an anode terminal;
a cathode terminal;
a gate terminal;
a semiconductor substrate of a first conductivity type;
a thyristor formed in said substrate;
said thyristor including a base layer of a second conductivity type formed in a first major surface layer of said substrate, an emitter layer of the first conductivity type formed in the surface layer of said base layer, an emitter layer of the second conductivity type formed in a second major surface layer of said substrate, and a base region of the first conductivity type sandwiched by the base layer of the second conductivity type and the emitter layer of the second conductivity type;
a first insulated gate field effect transistor formed in the semiconductor substrate, said transistor including a first well region of the second conductivity type, which is formed in said first major surface of said substrate while being apart from said base layer of the second conductivity type, a first drain and a first source both being of the first conductivity type and formed in the surface layer of said first well region, a gate oxide film formed in the substrate and between said first drain and said first source, and a first gage electrode formed on said gate oxide film;
a second insulated gate field effect transistor formed in said substrate, said transistor including a second well region of the second conductivity type, which is formed in said first major surface of said substrate while being apart from said first well region and said base layer of the second conductivity type, a second drain and a second source both being of the first conductivity type and formed in the surface layer of said second well region, a gate oxide film formed on the substrate and between said second drain and said second source, and a second gate electrode formed on said gate oxide film;
a separation layer of said second conductivity type formed in said first major surface of said substrate and apart from said base layer of the second conductivity type, and said first and second well regions;
a first electrode interconnection formed on the major surface of said substrate and for interconnecting said separation layer, said first gate electrode and said second drain layer;
a second electrode interconnection for electrically interconnecting said base layer of the second conductivity type, said first drain layer, said second gate electrode and said gate terminal;

a third electrode for electrically interconnecting said emitter layer of the first conductivity type, said first well region, said first source layer, said second well region, said second source layer and said cathode terminal; and a fourth electrode interconnection for electrically connecting said emitter layer of the second conductivity type and the anode terminal.

10. A semiconductor device according to claim 9, further comprising a first impurity-diffused layer of the first conductivity type formed in the surface layer of said first well region, the first impurity diffused layer being far away from said first drain layer, said first source layer, and the portion of the first well region which is between said first source and drain regions, and a second impurity-diffused layer of the first conductivity type formed in the surface layer of said second well region, the second impurity diffused layer being far away from said second drain layer, said second source layer, and the portion of the second well region which is between said second source and drain regions.

11. A semiconductor device according to claim 9, wherein said second electrode interconnected includes a first resistive layer coupled between said base layer of the second conductivity type and said first drain layer, on the one hand, and said second gate electrode and said gate terminal, on the other hand.

12. A semiconductor device according to claim 10, wherein said second electrode interconnection includes a first resistive layer coupled between said base layer of the second conductivity type and said first drain layer, on the one hand, and said second gate electrode and said gate terminal, on the other hand.

13. A semiconductor device according to claim 9, further comprising a second resistive layer connected between said third electrode interconnection and said second electrode interconnection at an electrical location between said emitter layer of the first conductivity type and said first resistive layer.

14. A semiconductor device according to claim 10, further comprising a second resistive layer connected between said third electrode interconnection and said second electrode interconnection at an electrical location between said emitter layer of the first conductivity type and said first resistive layer.

15. A semiconductor device according to claim 11, further comprising a second resistive layer connected between said third electrode interconnection and said second electrode interconnection at an electrical location between said emitter layer of the first conductivity type and said first resistive layer.

16. A semiconductor device according to claim 12, further comprising a second resistive layer connected between said third electrode interconnection and said second electrode interconnection at an electrical location between said emitter layer of the first conductivity type and said first resistive layer.

17. A semiconductor device comprising:

an anode terminal;

a cathode terminal;

a gate terminal for receiving a gate signal;

a thyristor comprising an anode, a cathode, a cathode base, and an anode base, said anode being connected to said anode terminal, said cathode being connected to said cathode terminal, and said cathode base being connected to said gate terminal;

breakthrough prevention means, coupled between the cathode base of the thyristor and the cathode terminal, and switchable between an on and an off state, for short-circuiting together the cathode and the cathode base of the thyristor, at times when the breakthrough prevention means is in the on state, and having a control terminal for receiving a control signal to turn off the breakthrough prevention means; and control means, coupled to the control terminal of the breakthrough prevention means, and switchable between an on and an off state, for providing the control signal to the control terminal of the breakthrough prevention means, at times when the control means is in the on state, to turn off the breakthrough prevention means, and having a control terminal coupled to the gate terminal for receiving the gate signal to turn on the control means.

18. A semiconductor device comprising:

an anode terminal;

a cathode terminal;

a gate terminal for receiving a gate signal;

a thyristor comprising an anode, a cathode, a cathode base, and an anode base, said anode being connected to said anode terminal, said cathode being connected to said cathode terminal, and said catyhode base being connected to said gate terminal;

breakthrough prevention means, coupled between the cathode base of the thyristor and the cathode terminal, and switchable between an on and an off state, for short-circuiting together the cathode and the cathode base of the thyristor, at times when the breakthrough prevention means is in the on state, to prevent erroneous triggering of the thyristor in response to a transient voltage, and having a control terminal for receiving a control signal to turn off the breakthrough prevention means; and control means, coupled to the control terminal of the breakthrough prevention means, and switchable between an on and an off state, for providing the control signal to the control terminal of the breakthrough prevention means, at times when the control means is in the on state, to turn off the breakthrough prevention means to permit triggering of the thyristor, and having a control terminal coupled to the gate terminal for receiving the gate signal to turn on the control means.

* * * * *